United States Patent
Clough

(10) Patent No.: US 6,783,856 B1
(45) Date of Patent: Aug. 31, 2004

(54) METAL OXYANION COATED POROUS SUBSTRATES

(75) Inventor: Thomas J. Clough, Grover Beach, CA (US)

(73) Assignee: Ensci Inc, Pismo Beach, CA (US)

( * ) Notice: Subject to any disclaimer, the term of this patent is extended or adjusted under 35 U.S.C. 154(b) by 0 days.

(21) Appl. No.: 10/407,750

(22) Filed: Apr. 7, 2003

(51) Int. Cl.⁷ ............................................... B32B 15/02
(52) U.S. Cl. ....................... 428/403; 428/404; 428/406; 428/407; 585/671; 585/670; 585/750; 502/200; 423/351; 423/385; 208/112
(58) Field of Search ................................ 428/403, 404, 428/406, 407; 585/671, 670, 750; 502/200; 423/351, 385; 208/112

(56) References Cited

U.S. PATENT DOCUMENTS

| | | | |
|---|---|---|---|
| 5,324,690 A | | 6/1994 | Gelatos et al. |
| 5,444,173 A | * | 8/1995 | Oyama et al. ............... 585/671 |
| 6,207,304 B1 | * | 3/2001 | Law et al. ................... 428/698 |
| 6,395,106 B1 | * | 5/2002 | Minevski et al. ........... 148/276 |
| 6,458,512 B1 | * | 10/2002 | Budd et al. .................. 430/311 |
| 6,471,788 B1 | * | 10/2002 | Minevski et al. ........... 148/273 |

\* cited by examiner

*Primary Examiner*—Leszek B Kiliman
(74) *Attorney, Agent, or Firm*—Frank J. Uxa

(57) ABSTRACT

Metal oxyanion coated substrates are disclosed comprising a three dimensional inorganic porous substrate having a coating of metal oxyanion on at least a portion of all three dimensions thereof, produced by a unique process having particular applicability to the manufacture of metal oxysulfide, oxycarbide and oxynitride coated three dimensional substrates. Certain novel coated substrates, such as diatomite porous substrates are disclosed. The coated substrates are useful in polymers, catalysis, heat dissipation and shielding applications.

20 Claims, No Drawings

METAL OXYANION COATED POROUS SUBSTRATES

BACKGROUND OF THE INVENTION

The present invention relates to a process for coating powder particle substrates, the coated powder particle substrates and to applications and uses thereof. More particularly, the invention relates to coating powder particle substrates with a metal oxyanion containing material, such material preferably being an electrically and/or thermally conductive oxyanion containing material and such coated powder substrates.

In many applications using powder it would be advantageous to have an electrically and/or thermally conductive; radiation absorbing and/or improved mechanical oxyanion coatings which are substantially uniform, have high and/or designed conductivity and/or radiation absorbing properties and/or improved mechanical properties and have good chemical properties, e.g., morphology, stability, corrosion resistance, etc.

A number of techniques have been employed to provide certain metal oxyanion coatings on fixed generally larger size substrates. For example, the CVD processes are well known in the art for coating a single flat surface, which is maintained in a fixed position during the contacting step. The conventional CVD process is an example of a "line-of-sight" process or a "two dimensional" process in which the metal oxyanion is formed only on that portion of the substrate directly in the path of the metal source as metal oxyanion is formed on the substrate. Portions of the substrate, particularly internal and external surfaces, which are shielded from the metal oxyanion being formed, e.g., such as the opposite side and edges of the substrate which extend inwardly from the external surface and substrate layers which are internal or at least partially shielded from the depositing metal oxyanion source by one or more other layers or surfaces closer to the external substrate surface being coated, do not get uniformly coated, if at all, in a "line-of-sight" process. Such shielded substrate portions either are not being contacted by the metal source during line-of-sight processing or are being contacted, if at all, not uniformly by the metal source during line-of-sight processing. A particular problem with "line-of-sight" processes is the need to maintain a fixed distance between the source and the substrate. Otherwise, metal oxyanion can be deposited or formed off the substrate and lost, with a corresponding loss in process and reagent efficiency.

There has been a need to develop processes for producing metal oxyanion coated powder substrate particles and processes, particularly under fast reaction processing conditions, which provide short processing times required for producing high quantities of metal oxyanion coated powder particle substrates and to produce unique metal oxyanion coated powder substrates having improved properties

BRIEF SUMMARY OF THE INVENTION

A new process, e.g., a "non-line-of-sight" or "three dimensional" process, useful for coating of three dimensional powder particle substrates has been discovered. As used herein, a "non-line-of-sight" or "three dimensional" process is a process which coats surfaces of a powder substrate with a metal oxyanion coating which surfaces would not be directly exposed to metal oxyanion forming compounds being deposited on the external surface of the substrate during the first line-of-sight contacting step. In other words, a "three dimensional" process coats coatable powder substrate surfaces which are at least partially shielded by other portions of the powder substrate which are closer to the external surface of the powder substrate and/or which are further from the metal oxyanion forming source during processing, e.g., the internal and/or opposite side surfaces of for example glass, ceramic or mineral powder particle substrates such as fibers, spheres, flakes or other shapes or surfaces including porous shapes.

A new fast reaction, elevated temperature process for coating a three dimensional powder substrate having shielded surfaces with a metal oxyanion, preferably a conductive or radiation absorbing or mechanically improved metal oxyanion coating on at least a part of all three dimensions thereof and on at least a part of said shielded surfaces thereof has been discovered. In brief, the process comprises forming a reaction mixture comprising powder substrate particles, a metal oxyanion precursor, for example, silicon, aluminum, boron, zirconium, lanthanum and titanium precursors, such as oxide, partial oxide and chloride containing precursors, an anion forming precursor said metal and the anion of said precursors being chemically different and an oxy precursor chemically the same or different than one or both of said metal oxyanion and anion forming precursor and reacting the reactant mixture under fast reaction short residence time, high temperature conditions in a reaction zone to form a metal oxyanion coated substrate and recovering such coated substrate, preferably a conductive or radiation absorbing or mechanically improved oxyanion containing coated substrate.

The anion forming precursor is typically a precursor agent that provides the anion portion of the metal such as boron, nitrogen, silicon, carbon and sulfur. The anion forming precursors can be in the form of a gas, liquid or solid for example methane and carbon powder as a source for carbon, nitrogen and ammonia as a source for nitrogen, boron halides such as boron trichloride as a source for boron, sulfur halides and hydrogen sulfide as a source for sulfur and various silicon halides and hydrosilicides as a source for silica.

The forming of the metal oxyanion precursor/substrate, the oxy precursor and anion forming precursor reactant mixture preferably takes place closely in time to reacting in the reaction zone. In a particularly preferred embodiment, the reaction mixture after formation is introduced directly into the high temperature reaction zone under fast reaction processing reducing conditions. The coated powder substrate is then recovered by conventional means.

The process can provide unique coated substrates including single and mixed oxyanions which have application designed conductivity and/or absorbing properties and/or improved mechanical properties so as to be suitable for use as components such as additives in a wide variety of applications. Substantial coating uniformity, e.g., in the thickness of the metal oxyanion coating is obtained. Further, the present metal oxyanion coated substrates in general have outstanding stability, e.g., in terms of electrical, thermal and mechanical properties and morphology and are thus useful in various applications.

DETAILED DESCRIPTION OF THE INVENTION

The present coating process comprises forming a reactant mixture of a powder substrate, a metal oxyanion precursor, such as metal partial oxide and/or chloride forming components, metal complexes and mixtures thereof, an anion forming precursor and an oxy precursor and reacting the reactant mixture, at fast reaction, elevated temperature process conditions, preferably reducing conditions, effective to form a metal oxyanion coating on the powder substrate. The components of the reactant mixture are reacted at conditions effective to convert the metal oxyanion precursor to metal oxyanion and form a metal oxyanion containing coating, preferably a conductive, or radiation absorbing metal oxyanion containing coating, on at least a portion of the three dimensions of the substrate. The process as set forth below will be described in many instances with reference to various compounds of silica, titanium, aluminum, zircomium and boron which have been found to provide particularly outstanding process and product properties. However, it is to be understood that other suitable metal oxyanion precursors are included within the scope of the present invention.

As set forth above the reactant mixture is subjected to fast reaction processing conditions at elevated temperatures in order to form a metal oxyanion coating on the substrate. The reactant mixture preferably should be formed prior to high temperature fast reaction processing conditions. This reduces metal oxyanion precursor forming off of the substrate which decreases the yield of metal oxyanion coated substrate. By "forming" is meant that the metal oxyanion precursor is preferably associated with the powder substrate before deleterious reaction of the metal oxyanion precursor with the oxy precursor and/or anion forming precursor can take place off the substrate, such as not to be associated with the substrate as a coating. It has been found that the preferred reactant mixtures are those that are formed proximate in time to the introduction of the reactant mixture into the high temperature fast reaction zone. Thus for example, the reactant mixture can be a liquid slurry wherein the metal oxyanion precursor is soluble in the liquid and/or an insoluble solid in the liquid slurry. Further, the liquid slurry can be a suspension of the metal oxyanion precursor. The metal oxyanion precursor preferably is a precipitate on the substrate in the liquid solid slurry. Further the reactant mixture can be a solid or flowable powder form such as a precursor powder and/or precipitate and/or liquid film coating of metal oxyanion precursor. Each of the above reactant mixtures can offer unique and distinct processing product advantages in the process of this invention. The liquid slurry reactant mixtures are preferably atomized, such as gas atomized, upon introduction with the substrate into the reaction zone for conversion to the metal oxyanion coated substrates. Further, the flowable powder reactant mixtures such as metal oxyanion precursor powder, precipitate and/or liquid film reactant mixtures, can be air fluidized into the reaction zone or gravity or mechanically fed into the reaction zone. For liquid reactant mixtures, it is preferred to maximize the concentration of the substrate in the liquid slurries on a wt % basis so as to maximize the association of the metal oxyanion precursor with the substrate. It is preferred that the concentration of substrate in liquid slurries be from about 10 to 65 wt % more preferably from about 30 to 60 wt % or higher. As is recognized by those of skill in the art, the viscosity of the slurries will vary as a function of the particle size, its geometry and density. Viscosities are used which allow for overall optimum process efficiencies on a product quality and throughput basis.

The anion forming precursor can be a gas, liquid or a solid. As set forth above the anion forming precursor can be a gas such as methane, chloro methanes and ethanes, nitrogen, ammonia, boron trichloride, hydrogen sulfide and the like. The anion forming precursor associates with the metal oxyanion precursor/substrate and oxy precursor at and during the reactions in the reaction zone. For example the anion forming precursor in the form of a gas can be at least a part of the carrier gas used to atomize and/or fluidized the substrate metal oxyanion precursor. Further, the anion precursor gas can be introduced into the reaction zone with the metal oxyanion precursor substrate such that reaction takes place for the conversion to metal oxyanion coating on the substrate. In addition the anion forming precursor can be in the form of a solid such as a powder which is also associated with the substrate similar to or the same as the metal oxyanion precursor. As set forth above, there is an intimate association of the metal oxyanion, oxy precursor and anion forming precursors in order for fast reaction conversion to the metal oxyanion coating on the substrate to occur at the short residence time, high temperature conditions in the reaction zone.

The fast reaction processing conditions as set forth above include a very short reaction residence time for the powder particles in the elevated temperature reaction zone. "Reaction zone" is defined as that zone at elevated temperature wherein fast reaction of the metal oxyanion precursor with the oxy precursor and anion forming precursor takes place on the substrate such that the metal oxyanion precursor is not substantially lost as separate metal oxyanion particles not associated with the substrate. Thus the reaction zone allows for association of the metal oxyanion precursor on the substrate wherein subsequent processing will not substantially adversely affect the overall metal oxyanion coating on the substrate. It is important that the residence time in the elevated temperature reaction zone associate the metal oxyanion precursor with the substrate. It is contemplated within the scope of this invention that further processing such as conditions to promote further reduction, uniform crystallinity and/or coating densification can be carried out according to the process of this invention.

The fast reaction processing conditions in the reaction zone can vary as to temperature and residence time according to the physical and chemical properties of the metal oxyanion precursor and substrate. The average particle residence time in the reaction zone is less than about one second preferably from about 0.5 milliseconds to about 1 second, more preferably from about 1 millisecond to about 500 milliseconds and still more preferably from about 5 milliseconds to about 250 milliseconds. Further, the residence time can be defined by the particle velocity in the reaction zone. Preferably the average particle velocity in the reaction zone is from about three to about 30 meters/second, more preferably from about three to about 10 meters/second.

The elevated temperature in the reaction zone is maintained by a thermal source that rapidly transfers thermal energy to the reactant mixture. The unique combination of reactant mixture, short residence time and a thermal source for rapid thermal transfer provides for rapid association of the metal oxyanion precursor with the substrate on both external and shielded surfaces without substantially adversely effecting the solid integrity of the substrate. By the term solid integrity is meant that the substrate retains at least a part preferably a majority an even more preferably a substantial majority of the substrate as a solid under the temperature conditions in the reaction zone. Depending on the physical and chemical properties of the substrate the surface and near surface of the substrate can become reactive and/or melt under the thermal conditions in the reaction zones. The highly reactive surface and/or rapid melting and solidification for certain substrates can provide enhanced properties associated with the metal oxyanion coating such as barrier properties, binding properties and preferential crystalline surface formation by the substrate. The short residence times in the reaction zones allow for rapid chemical reactions and rapid quench when the substrate particles leave the reaction zone.

One of the unique advances of the process of this invention is the formation of very thin metal oxyanion coatings on powder substrates without substantially adversely affecting the solid integrity of the substrate, i.e. the inner core of the substrate is essentially chemically unaltered. Thus, the metal oxyanion precursor associated with or formed from the substrate as a thin film and/or the outer surface of the substrate has a reactive surface which exhibits high reactivity as a precursor and provides for the formation of the metal oxyanion coating under fast reaction processing conditions. Thus, only the thin film metal oxyanion precursor and/or reactive surface on the substrate have to be converted via reaction with the oxy precursor and anion forming precursor. As set forth above, the substrate retains an inner core of essentially the same chemical composition as the original starting substrate. Thus, in the preferred embodiment of this invention, the metal oxyanion precursor can be for example a preassociated flowable powder, i.e. a precoat of a powder, precipitate or film forming liquid or the surface itself of the substrate where thin film reaction with the oxy precursor and anion forming precursor takes place in the reaction zone. Typical examples of substrate coating surface reaction on at least a part of all three dimensions thereof are oxycarbonation and oxynitridation of aluminum, boron and titanium oxides or partial oxides.

The thermal source produces elevated temperatures that allow for the reactant mixture to rapidly produce metal oxyanion coated substrates and allows residence times that provide for the association of the metal oxyanion precursor with the substrate and reaction with the oxy precursor and anion forming precursor. Thus the thermal source must allow for control of the elevated temperature to produce metal oxyanion coated substrates and a residence time which allows the chemical reactions and/or association of the metal oxyanion precursor with the substrate to take place on the substrate. The preferred thermal sources which allow for control of elevated temperatures and the residence times necessary for chemical reaction and/or association of the metal oxyanion precursor with the substrate are induction plasma sources preferably RF induction plasma sources and flame combustion sources.

As set forth above, the thermal source provides an elevated temperature that primarily acts on the metal oxyanion precursors, oxy precursor and anion forming precursor such that the powder substrate, primarily the internal portions of the substrate are at a lower temperature than the external temperature in the reaction zone. As will be more fully described below, the typical substrate can have a relatively low heat transfer coefficient which when combined with the short residence times in the reaction zone allows for such differential between the external temperature and the internal temperature of the substrate. Further the processing conditions can be adjusted to take advantage of this thermal gradient particularly as to selective reaction of the anion forming precursor on the surface, melting and resolidification and crystallization on the surface and near surface of the substrate. Further, the temperature within the reaction zone is controlled to allow rapid reaction of the metal oxyanion precursors, oxy precursor and anion forming precursor which reactions can increase substantially the association of the coating with the substrate and yields, i.e. reduced tendency towards volatilization and further the completion of the overall reaction to metal oxyanion coating. As set forth above, one of the major advances is the association of the metal oxyanion precursor coating through the reaction zone into the quench stage. The recovered metal oxyanion coated substrates can be further annealed for further densification, crystallization and minimizing the presence of deleterious amounts of contaminants such as oxygen.

RF inductively coupled plasma systems are well known to those of ordinary skill in the art and typically consist of an RF power generator supplying a RF current to an induction coil wound around a plasma confinement tube. The tube confines the plasma discharge. Power levels for plasma systems can vary from about 10 kW up to about 500 kW. Typical frequencies vary from about 0.3 MHz to even as high as 14 MHz. Typical ranges are in the 0.3 to 5 range.

The plasma system typically uses three different gases including a central gas sometimes referred to as a central swirl gas used primarily for formation of the plasma, a sheath gas used primarily to stabilize and center the plasma and a third carrier gas which typically is used to transport a powder feed and/or atomize a liquid slurry feed. As is recognized by those of ordinary skill in the art, the composition of all three gases can vary and can include gases such as argon, nitrogen, hydrogen and oxygen as well as other gases such as anion forming precursor gases. In addition mixtures of varying gases can be used depending on the characteristics of the plasma that is required for the process. As set forth above, a component of the plasma gases can serve as an anion forming precursor, the oxy precursor and a reducing agent. In other cases, a secondary gas can be injected into the plasma or sheath surrounding the plasma to provide the anion forming precursor and/or oxy precursor. The gases used as sheath, central and carrier gases can be different or the same and mixtures of different gases can be used. For example, a reducing gas can be used for the sheath, central and carrier gas or various other gases, such as argon, can be combined with the sheath or central gas.

As set forth above the oxy precursor can be chemically the same or different than one or both of said metal oxyanion and anion forming precursors. Thus for example, the oxy precursor can be derived from the metal oxyanion precursor when for example the metal oxyanion precursor contains oxygen such as a metal oxide or metal partial oxide. Further, the oxy precursor can be chemically the same as the anion forming precursor when for example the anion forming precursor also contains the oxy precursor such as nitrogen oxides that can decompose into a nitrogen oxide and oxygen, such as the decomposition of nitrous oxide to oxygen and nitric oxide. Further the oxy precursor can be oxygen such as oxygen contained in air. For example metal chlorides as set forth above can be formed into a reaction mixture with ammonia and oxygen to form an oxynitride. Further metal oxides can be combined with, for example, ammonia, and/or ammonia and hydrogen and/or hydrogen and nitrogen to form a metal oxynitride. As set forth above a reducing atmosphere can be used to facilitate the formation of the metal oxyanion products. For example metal oxides can be combined with a carbon source such as a low molecular weight gas such as methane or ethane and hydrogen to form a metal oxycarbide. Still further examples are mixed metal oxyanions that can be formed from mixtures of metal oxyanion precursors. For example aluminum trichloride and silica tetrachloride can be combined with ammonia and oxygen to form a silica aluminum oxynitride.

The gas flow rates for the central, sheath and carrier gases can vary over a wide range with such ranges being adjusted to within the residence time and particle velocities required for the conversion of the metal oxyanion precursor to coated metal oxyanion substrate. In general the rate of introduction of the sheath, central and carrier gases will vary with typically the sheath gas being introduced at a rate of from about three to about five times that of the central swirl gas. In addition, the central swirl gas rate will generally be higher than the carrier gas since the carrier gas is used to control the rate at which the reactant mixture is introduced into the reaction zone. The gas compositions and flow rates can be optimized to provide desired process conditions. For example, nitrogen can be introduced into the central gas in order to lower the overall temperature profile within the reaction zone. Typically the other gas rates and/or partial pressure within the given gas composition are lowered in order to control the particle residence time and particle velocities within the reaction zone. Further, the anion forming precursor and oxy precursor content in the various gases within the reaction zone can be adjusted to provide near stochiometric quantities or slight excess in order to limit the amount present in the later portion and tail of the reaction zone. In addition, anion forming and oxy precursor enrichment can take place such as the introduction of anion forming precursor at the tail of the reaction zone to provide enhanced overall reaction conditions prior to quench. Typically, the enthalpy of the gas composition is controlled so as to maintain the elevated temperature that promotes rapid reaction of the metal oxyanion precursors with the oxy precursor and anion forming precursor on the substrate. Thus the enthalpy of components such as hydrogen and organic components added as part of the liquid slurry and powder reaction mixtures are taken into consideration for defining the temperature required in the reaction zone. Further, the gas rates (volume of gas per unit time) will vary depending on the size and design of the process equipment. As set forth above, the residence times are long and the particle velocities slow when compared to typical sonic and supersonic plasma type systems. As is set forth above, the oxy precursor and anion forming precursor under thermal process conditions allow for the reaction of metal oxyanion precursor to metal oxyanion coating on the substrate to take place within the reaction zone. It has been found that the residence times and/or particle velocities as set forth above together with the control of gas composition and temperature conditions allow for the reactions to take place on the substrate to produce the metal oxyanion coated substrates. The control by the thermal source of the temperature in the plasma or adjacent to the plasma, i.e. reaction zone, allows for the reactions to take place while not substantially adversely effecting the solid integrity of the substrate. Further, the temperature and the dimension of the plasma can be adjusted so as to provide selective reaction with the oxy precursor and anion forming precursor and/or melting on the surface or near surface of the substrate to enhance overall reaction, bonding and uniformity of the metal oxyanion coating on the substrate. As set forth above, the temperature, particle residence time and oxy precursor and anion forming precursor concentration allow for the conversion of the metal oxyanion precursor to metal oxyanion coating while not adversely effecting the solid integrity of the substrate. Thus, the temperature within the reaction zone can vary according to the above process conditions and typically are in the range of from about 1000° K. to about 4500° K., more preferably from about 1500° K. to about 3500° K. As set forth above, the temperature can be moderated by auxiliary gases including inert gases.

The reactant mixture can be introduced into the plasma at varying locations within the plasma including the tail, i.e. terminal, portion of the plasma flame. The reactant mixture in addition can be introduced laterally into or adjacent to the plasma flame and/or the tail of the plasma flame or at varying angles to the plasma including perpendicular to the plasma or the plasma tail. In a typical system configuration a probe of appropriate metallurgy such as inconel, is centrally mounted in the plasma confinement tube. Typically a quartz tube is interposed between the probe and the confinement tube. The central gas in injected into the quartz tube and the sheath gas is injected in the annular passage defined between the quartz tube and the plasma confinement tube. Conventional cooling of the system is used. The reactant mixture feed probe can be used to gas atomize the liquid slurry reaction mixtures of this invention and/or gas atomize, such as with an inert and/or anion forming precursor gas and mixtures thereof, the powder feeds of this invention. For example, in the liquid slurries, fine droplets of the liquid slurries can be injected typically into the central portion of or adjacent to the plasma discharge. Further, the position of the injection probe within or adjacent to the plasma for powder or liquid slurries can be varied such as to optimize the performance and overall yields of metal oxyanion coated substrates. As is set forth above, the reaction mixture can be introduced into the tail of the plasma discharge such as laterally or at an angle into the plasma tail. It is preferred that the reactant mixtures from liquid slurries to powders be introduced into the reaction zone with a carrier gas, particularly an inert and/or reducing and/or oxy precursor and/or anion forming precursor containing carrier gas and mixtures thereof which enhances the rate of reaction of the metal oxyanion precursor to metal oxyanion coating on the substrate. The powders can be gravity fed and/or continuously fed such as by screw feeders into the plasma. In a preferred embodiment of this invention, the concentration of the substrate in the liquid slurries can be maintained at a relatively high concentration such as from 30 to 60-wt % or higher in order to optimize the interaction between the metal oxyanion precursor and substrate. The concentration can be adjusted in order to maintain a liquid reactant mixture viscosity which enhances atomization of the liquid reactant mixture and overall steady state process and plasma conditions for conversion and yield of metal oxyanion coated substrate. Further, the reaction zone can be run at varying pressures including reduced pressures through higher pressures above atmospheric. The choice of pressure is generally a function of the characteristics of the metal oxyanion precursor, oxy precursor and anion forming precursor. It is preferred to maintain such conditions of pressure which improve the overall conversion and yield of metal oxyanion coating on the substrate while reducing and/or minimizing the reaction of metal oxyanion precursor to metal oxyanion off of the substrate.

The feed rates of the liquid slurries and powders in general are a function of the reaction zone design and size. In general for small scale reaction zone designs a feed rate of from 100 grams to 500 grams per hour can be used, whereas for larger scale, a feed rate of from 0.5 Kg to 50 Kg per hour can be used.

The liquid slurries and flowable powder reactant mixtures can contain various substantially nondeleterious materials including solvents, i.e. organonitrogen containing solvents for liquid slurries and organic polymeric binders which may decrease or increase the elevated temperature or enthalpy in the reaction zone. The thermal contribution of these materials is used in order to design the thermal profile in the reaction zone in order to maximize steady state process conditions and conversion and yields of metal oxyanion coated substrate. Further, the use of such materials, particularly, organic materials can be used to adjust the composition of the plasma gases as a function of the gas composition from gas entry to exit from the reaction zone. For example, the hydrogen requirement for a given reaction of metal oxyanion precursor to metal oxyanion coating can be adjusted such that a portion of the plasma and gas composition exiting the tail of the plasma can be in an overall reducing environment. The process flexibility in the introduction of varying gases of varying characteristics allows such changes in gas composition as a function of plasma profile and exit gases to be made. For example, in the use of partial oxide and metal chloride precursors it has been found that a staged reducing environment can enhance overall conductivity of a metal oxyanion film on a substrate. Further, the use of carbon dioxide such as in very low oxygen containing gases from partial combustion of hydrocarbon can be used advantageously to promote the formation of a multiple reduction zones within the reaction zones and/or a reduction zone following the exit of the plasma gas from the reaction zone. Further, it is possible to add auxiliary gases such as reducing gases into the plasma at different introduction points within the plasma.

The metal oxyanion coated substrates exit the reaction zone and are rapidly quenched to lower temperatures including temperatures wherein relatively low, preferably no significant chemical change is taking place of the metal oxyanion coating. The metal oxyanion coated substrates are recovered by conventional means such as typical powder particle collection means. As set forth above, the metal oxyanion coated substrates can be further processed such as by annealing to further densify the metal oxyanion coatings and/or more fully develop the optimum crystal structure for enhancing overall conductivity and/or absorbing of the final coated substrate.

As set forth above, the thermal source can be obtained from combustion such as a flame produced by the combustion of a gas such as acetylene, methane or low molecular weight hydrocarbons, hydrogen and ammonia. The thermal and kinetic energy associated with the combustion process can be varied to provide elevated temperatures and residence times and/or particle substrate velocity within the ranges as set forth above at non-stoichiometric flame or reducing gas conditions. The combustion flame process provides a reaction zone wherein the gas composition within the reaction zone can be varied according to the gas combustion characteristics used to provide the reaction zone. Further, the composition of the gas can be varied according to the type of gas used in the combustion process and the ratio of combustion gas to inert gas that is used to produce a reducing flame. Thus the amount of residual oxygen, carbon dioxide and water vapor can be limited by varying the stoichiometry of the reactants, the type of fuel source and reducing conditions. Further, auxiliary gases can be added to moderate and modify the combustion flame characteristics. In addition, such auxiliary gases including inert gases can be added directly into the combustion flame or as a sheath, i.e. curtain or shroud, surrounding the combustion flame. Further, the reactant mixture can be introduced directly into the combustion flame or as in the case of the RF induction plasma at varying angles to the flame or on the outer or adjacent surface or tail of the flame. The temperature profiles within the combustion flame are typically lower than the temperatures that can be achieved in the RF induction plasma typically in the range of from about 750° K. to about 1,500° K. The unexpected process improvement for producing metal oxyanion coated substrates with the combustion process is the formation of a reaction zone at temperatures and residence times which allow for the conversion of the metal oxyanion precursor on the substrate to the coating. The various embodiments set forth above with respect to reaction mixture introduction into the reaction zone, preference for atomization of the reaction mixtures, variations on introduction of the reaction mixtures at various locations within the reaction zone or at the tail end of the reaction zone, variations in gas composition such as reducing zones are applicable to the combustion processes.

The thickness of the metal oxyanion-containing coating can vary over a wide range and optimized for a given application and is generally in the range of from about 0.01 to about 0.75 microns or even from about 0.01 to about 0.5 microns, more preferably from about 0.02 microns to about 0.25 microns, still more preferably from about 0.02 microns to about 0.1 micron.

The reactant mixture may also include one or more other materials, e.g., dopants, catalysts, grain growth inhibitors, binders, solvents, etc., which do not substantially adversely affect the properties of the final product, such as by leaving a detrimental residue or contaminant in the final product after formation of the metal oxyanion containing coating. Thus, it has been found to be important, e.g., to obtaining a metal oxyanion coating with good structural, mechanical and/or electronic and/or magnetic properties, that undue deleterious contamination of the coating be avoided. Examples of useful other materials include organic components such as organic nitrogen solvents, such as acetonitrile, dichloro acetonitrile, pyridene, chloropyridene pyrrole and mixtures thereof; certain halogenated hydrocarbons, particularly chloro and mixtures thereof. Certain of these other materials may often be considered as a carrier, e.g., solvent, and/or anion forming precursor for the metal oxyanion precursor to be associated with the substrate to form the reactant mixture.

The metal oxyanion coatings are typically derived from transition metal precursors, which contain transition elements and Group III and Group IV metals. Examples of such metals are boron, aluminum, silica, tin, nickel, chromium, tungsten, titanium, molybdenum and zirconium. The preferred elements are aluminum, boron, silica, tungsten, titanium, molybdenum and zirconium.

As set forth above the metal oxyanion precursor is preferably selected from the group consisting of one or more metal chlorides, metal partial oxides, oxides, organic complexes and organic salts. Further, it is preferred that metal chlorides, organic complexes and salts and oxides do not allow substantially deleterious residual oxygen to remain in the coating under the conditions of conversion to metal oxyanion in the reaction zone. Particularly preferred metal oxyanion precursors are metal chlorides and lower valence organic nitrogen complexes.

Typical examples of metal chloride precursors are nickel chloride, lanthanum chloride, zirconium chloride, aluminum chloride, ferric chloride, tungsten pentachloride, tungsten hexa chloride, molybdenum pentachloride, indium dichloride, indium monochloride, chromium$^2$ chloride and titanium tetrachloride. Preferred metal complexes are polyfunctional nitrogen complexes wherein such functionality is capable of complexing with the metal. Typical examples of oxides are silica, boron oxide and boric acid.

Typical examples of anion forming precursors that produce borides are boron trichloride, borazine, diborane, and triethoxy boron; that produce nitrides are nitrogen and ammonia; that produce silicides are silanes and hydrosilicides; that produce carbides are methane, powdered carbon, low molecular weight halogenated hydrocarbons particularly chloro hydrocarbons, ethane and propane and that produce sulfides are hydrogen sulfide and sulfur halides. In the practice of this invention, the anion forming precursor is selected for the final metal oxyanion coating to be obtained, and anions not desired in the final coating should be avoided in the reactants and in the reaction zone.

As set forth above the oxy precursor can be derived from the metal oxyanion precursor, the anion forming precursor or from a separate compound such as oxygen. Further the oxy precursor can be derived from the decomposition of various types of oxide materials in the reaction zone including nitrous oxide, water and other similar components preferably gaseous components that provide the oxygen component for the metal oxyanion products of this invention.

The particular preferred coatings are silicon oxynitride, oxycarbide and oxyboride, aluminum oxynitride, zirconium oxycarbide and oxysilicide, tungsten oxysulfide, boron oxycarbide and oxynitride, titanium oxyboride, oxycarbide, oxycarbonitride, oxysilicide and oxynitride, molybdenum oxysilicide and oxysulfide and iron oxysilicide and oxynitride.

As set forth above, it has been found that the substrate can be contacted with a metal oxyanion precursor to form a flowable powder reactant mixture. For example, a metal oxyanion precursor can be applied to the substrate as a powder, a precipitate and/or as a liquid film particularly at a thickness of from about 0.05 to about 1 micron, the thickness in part being a function of the substrate particle size, i.e. smaller substrate particles generally require even smaller size precursors and thicknesses. The precursor can be applied dry to a dry substrate and as a charged fluidized precursor, in particular having a charge opposite that of the substrate or at a temperature where the precursor contacts and adheres to the substrate. In carrying out the precursor coating, a coating system can be, for example, one or more electrostatic fluidized beds, spray systems having a fluidized chamber, and other means for applying for example powder, preferably in a film forming amount. The amount of precursor used is generally based on the thickness of the desired metal oxyanion coating and incidental losses that may occur during processing. The process together with conversion to a metal oxyanion containing coating can be repeated to achieve desired coating properties, such as desired gradient conductivities.

Typically, the fluidizing gaseous medium is selected to be compatible with the metal oxyanion precursor powder, i.e., to not substantially adversely affect the formation of a metal oxyanion coating on the substrate during conversion to a metal oxyanion-containing film.

Generally, gases such as nitrogen, argon, helium and the like, can be used, with nitrogen being a gas of choice, where no substantial adverse reaction of the precursor takes place prior to the reaction to the metal oxyanion coating. The gas flow rate for powder coating is typically selected to obtain fluidization and charge transfer to the powder. Fine powders require less gas flow for equivalent deposition. It has been found that very small amounts of water vapor can enhance charge transfer. The temperature for contacting the substrate with a precursor is generally in the range of about 0° C. to about 100° C. or higher, more preferably about 20° C. to about 40° C., and still more preferably about ambient temperature. The substrate however, can be at temperatures the same as, higher or substantially higher than the powder.

The time for contacting the substrate with precursor is generally a function of the substrate bulk density, thickness, precursor size and gas flow rate. The particular coating means is selected in part according to the above criteria, particularly the geometry of the substrate. For example, particles, spheres, flakes, short fibers and other similar substrate, can be coated directly in a fluidized bed themselves with such substrates being in a fluidized motion or state. Typical contacting time can vary from seconds to minutes, preferably in the range of about 1 second to about 120 seconds, more preferably about 2 seconds to about 30 seconds.

Typical metal oxyanion precursor used for flowable reaction mixtures are those that are powder reaction mixtures at pre reaction zone conditions and can be liquidous or solid at the fast reaction process conditions at the elevated temperatures in the reaction zone. It is preferred that the precursor at least partially melt and substantially wet the surface of the substrate, preferably having a low contact angle formed by the liquid precursor in contact with the substrate and has a relatively low vapor pressure at the fast reaction and temperature conditions, preferably melting within the range of about 100° C. to about 650° C. or higher. As set forth above, the fast reaction process conditions can allow for the metal oxyanion precursor to rapidly react with the oxy precursor and anion forming precursor to a highly viscous and/or intermediate solid prior to substantial conversion to the metal oxyanion coating. The process conditions can allow for the association of this intermediate metal oxyanion component to form and reduce the volatilization and/or less of the metal oxyanion precursor off of the substrate.

As set forth above, the metal oxyanion precursors are preferably preassociated with the substrate and gas fluidized into the reaction zone. It has been found that the preassociation of a thin coating of metal oxyanion precursor becomes highly reactive in the reaction zone thereby reducing and/or minimizing the loss of metal oxyanion precursor through volatilization. Examples of such association of metal oxyanion precursor are fine powder coating of the substrate, precipitation of the metal oxyanion precursor on the substrate followed by drying such as spray drying, the formation of a liquid film on the flowable powder substrate such as by liquid droplets and conventional spray and dip coating processes for preparing dry films on powder substrates. Thus, for example an organic metal oxyanion precursor such as a titanate, a silane and/or other organic metal derivatives can be sprayed on the powder substrate and dried and/or contacted through the use of an aqueous medium followed by drying such as spray drying.

As set forth above, the metal oxyanion precursor can be associated with the substrate as a liquid slurry. For example, a liquid soluble metal chloride, i.e. chloride salt or a suspension and/or precipitated suspension, may be used. The use of liquid metal oxyanion precursor provides advantageous substrate association particularly efficient and uniform association with the substrate. In addition, coating material losses are reduced.

The metal oxyanion precursors set forth above with respect to flowable powders in general can be used also to make the liquid slurries. In addition, liquids, low melting and liquid soluble metal salts can be used advantageously for the liquid slurries.

As set forth above, it is preferred that the reaction mixture liquid slurries maximize the concentration of the substrate consistent with slurry viscosity and atomization requirements in the reaction zone. The amount of metal oxyanion precursor which is incorporated into the slurry is generally a function of the thickness of the metal oxyanion coating on the substrate for the final product. For example, a metal oxyanion coating of 50 nanometers will typically require less than a 150 nanometer metal oxyanion precursor coating. Further, the surface area of the substrate, typically a function of particle size per unit weight will effect the concentration of the metal oxyanion precursor. The reactant slurries can contain a solvent which allows for the solubilization and/or precipitation of the metal oxyanion precursor. The preferred solvents are organic heteroatom solvent systems which allow for solubilization of the metal oxyanion precursor and which do not contribute substantially deleterious anions to the desired coating. For example, a preferred liquid slurry which contains soluble metal oxyanion precursor is titanium tetrachloride. The liquid slurries in addition can have a pH higher or less than 7 which enhances overall solubility and/or precipitation.

The precipitated liquid slurry reaction mixtures can be made by forming a first soluble solution of an appropriate metal oxyanion precursor such as metal chloride salts in a solution such as a basic solution and adding such solutions slowly at elevated temperature such as from about 50° to 90° C. to a suspension of the substrate. The gradual addition of the metal oxyanion precursor solution generally in the presence of small amounts of hydroxyl ion in the substrate suspension provides for a slow and gradual partial hydrolysis and precipitation of the salts, preferably on the surfaces of the substrate in a uniform layer. The precipitant slurry reactant mixture is introduced into the reaction zone for conversion to the metal oxyanion coated substrate. One of the significant advantages of the process of this invention using precipitant slurry reaction mixtures is that the slurry itself can be directly fed into the reaction zone without requiring separation of the precipitant plus substrate, washing of the substrate and drying of the precipitant associated substrate. The precipitant slurry reaction mixture and the precipitant process are typically undertaken at high substrate liquid slurry concentrations without the introduction of deleterious contaminants. Thus it is preferred to use solvent systems which do not contribute deleterious contaminants to the metal oxyanion coating. If a source of hydroxyl ion is used to enhance the precipitation process it is preferred to use a source such as ammonium hydroxide which does not substantially interfere with the final properties of the metal oxyanion film. Further, in the case of precipitant reaction mixtures, the precipitant substrates can be filtered, washed of extraneous ions and reslurried for use as a reaction mixture. In order to control the viscosity of the liquid slurries, particularly at high substrate concentration a dispersant or defloculant can be added to reduce and/or minimize any substrate agglomeration.

The metal oxyanion precursor to be contacted with the substrate may be present in an atomized state. As used in this context, the term "atomized state" refers to both a substantially gaseous state and a state in which the metal oxyanion precursor is present as drops or droplets and/or solid dispersion such as colloidal dispersion in for example a carrier gas, i.e., an atomized state. Liquid state metal oxyanion precursors may be utilized to generate such reaction mixture.

Any suitable means can be utilized to produce "the atomized state." A particularly preferred atomized state is drops or droplets particularly as a droplet dispersion. Typical examples of droplet and/or aerosol generators include nozzles and ultrasonic atomizing nozzles. A particularly preferred atomization technique is an ultrasonic atomizing nozzle since the nozzle produces a soft, low velocity spray, typically in the order of three to five inches per second. Further, droplet sizes can be varied over a wide range depending on the particle size distribution of the substrate. A particularly preferred ultrasonic atomizing nozzle is manufactured by Sono-Tek Inc. such as model 8700-120. In a preferred process the ultrasonic generator produces a fine mist having an average droplet size of about 18 microns or less. The droplets are contacted with a carrier gas, typically an inert containing gas such as argon or a reactive anion forming precursor gas. In a preferred embodiment the carrier gas contains the dispersed substrate which allows for substrate and droplet association. The contacting between the carrier gas dispersed substrate and the droplets allow for a film forming amount of the droplets to become associated with at least a portion of the surfaces of the substrates. The substrate and droplets are typically maintained in a carrier gas fluidized condition which allows for association of the droplets with the substrates. Typically the contacting between the carrier gas substrate and droplets is at ambient temperature and for a period of time to allow for the association of the droplets on the substrate surfaces. In order to enhance contacting efficiencies a suitable apparatus such as a static mixer can be used to accelerate the droplet substrate association. The contacting time between the carrier gas substrate and droplets under the carrier gas fluidized conditions is typically less than twenty seconds, more typically less than ten seconds. In a preferred embodiment the droplet associated substrate in a fluidized carrier gas is contacted at fast reaction and elevated temperature reducing conditions in a reaction zone in the presence of an oxy precursor and anion forming precursor as set forth above. In a preferred embodiment the start of contacting under fast reaction conditions in the reaction zone is proximate in time to the association of the droplets with the substrate, typically at a substrate film reaction time after such substrate association of less than five seconds, more typically less than two seconds.

In a further preferred embodiment the metal oxyanion forming compound is combined to form a liquid mixture prior to droplet formation. This allows for the metal oxyanion forming compound to be intimately associated with the surfaces of the substrates. Further it is preferred that the metal oxyanion forming compound has a higher reaction rate in the reaction zone to metal oxyanion coating than the overall evaporation rate of the metal oxyanion forming compound. Thus, metal oxyanion forming compounds having boiling point above 100° C., more preferably above 150° C. at atmospheric pressure are preferred.

In addition to the other materials, as noted above, the reactant mixture may also include one or more grain growth inhibitor components. Such inhibitor component or components are present in an amount effective to inhibit grain growth in the metal oxyanion containing coating. Reducing grain growth leads to beneficial coating properties, e.g., higher conductivity, more uniform morphology, and/or greater overall stability. Among useful grain growth inhibitor components are components which include at least one metal ion, in particular potassium, calcium, magnesium, silicon, zinc and mixtures thereof. These components are typically used at a concentration in the final coating of from about 0.01 to 1.0 wt % basis coating. Of course, such grain growth inhibitor components should have no substantial detrimental effect on the final product.

The anion forming precursor may be deposited on the substrate separately from the metal oxyanion precursor, for example, before and/or during the metal oxyanion precursor/substrate contacting. If the anion forming precursor component is deposited on the substrate separately from the metal oxyanion precursor it should be deposited after the metal oxyanion precursor but before reaction to the metal oxyanion film.

Any suitable anion forming precursor may be employed in the present process and should provide sufficient anion forming precursor so that the final metal oxyanion coating has the desired properties, e.g., conductivity, stability, absorption properties, etc. Care should be exercised in choosing the anion forming precursor. For example, the anion forming precursor should be sufficiently compatible with, for example, the metal oxyanion precursor so that the desired metal oxyanion coating can be formed. Anion forming precursors which are excessively volatile (relative to the metal oxyanion precursor), at the conditions employed in the present process, can be used since, for example, the final coating can be sufficiently developed with the desired properties even though an amount of the anion forming precursor may be lost during processing. It may be useful to include one or more property altering components, e.g., boiling point depressants, in the reaction mixture. When used, such property altering component or components are included in an amount effective to alter one or more properties, e.g., boiling point, of the precursor, e.g., to improve the compatibility or reduce the incompatibility between the precursors.

As set forth above, the reaction zone gas phase constituents are typically adjusted to provide either a reducing or oxygen environment within the reaction zone, such as preferably with hydrogen or oxygen. Further, reducing conditions can be further enhanced at the tail end of the zone as the metal oxyanion coated particle substrates undergo reaction quench at significantly lower temperatures. The use of the combination of staged reduction zones within the reaction zone and tail portion of the reaction zone can be particularly beneficial for creating optimum properties, i.e. film uniformity, morphology and oxyanion stoichiometry without substantial deleterious oxide content.

In addition to stage reduction, the anion forming precursor when in the form of a gas can be staged for optimizing the contact efficiency with the metal oxyanion precursor coated powder substrate in the reaction zone. Further, the gaseous constituents in the reaction zone particularly under reducing conditions should be present at a concentration that enhances reduction of oxide type metal oxyanion precursors and/or contaminant oxygen that might enter the reaction zone. As set forth above, the metal oxyanion coating on the substrate should not have substantially deleterious contaminants such as the deleterious presence of contaminant amounts of metals and contaminant oxygen anion.

The liquid compositions, which include metal oxyanion precursor, can also include the anion forming precursor. In this embodiment, the anion forming precursor can be soluble and/or dispersed homogeneously and/or atomizeable as part of the reactant mixture. Such mixtures are particularly effective since the amount of anion forming precursor in the final metal oxyanion coating can be controlled by controlling the concentration of anion forming precursor in the reactant mixture. In addition, both the oxyanion precursor and anion forming precursor are associated with the substrate in one step.

The powder substrate preferably is composed of at least a part of any suitable inorganic material and may be in any suitable form. By the term suitable inorganic substrate is meant that the majority of the external surface of the particle substrate be inorganic, more preferably greater than about 75% and still more preferably greater than about 95% of the surface being inorganic. The internal core of the particle substrates can be organic, preferably organic polymers having high temperature thermal stability under the fast reaction temperature conditions in the reaction zone. The polymers can be thermoplastics or thermosets, preferably high temperature thermoplastics such as polyimides, polyamideimides, polyetherimides, bismalemides, fluoroplastics such as polytetrafluoroethylene, ketone-based resins, polyphenylene sulfide, polybenzimidazole, aromatic polyesters, and liquid crystal polymers. Most preferred are imidized aromatic polyimide polymers, para-oxybenzoylhomopolyester and poly(para-oxybenzoylmethyl) ester. In addition polyolefines, particularly crystalline high molecular weight types can be used. The preferred organic substrates are high temperature stable substrates, preferably inorganic organic substrates prepared by precoating the organic substrate with an inorganic precoat as set forth below.

Preferably, the substrate is such so as to minimize or substantially eliminate deleterious substrate, coating reactions and/or the migration of ions and other species, if any, from the substrate to the metal oxyanion-containing coating which are deleterious to the functioning or performance of the coated substrate in a particular application. However, a controlled substrate reaction which provides the requisite stoichiometry can be used and such process is within the scope of this invention. In addition, the substrate can be precoated to minimize ion migration, for example an alumina and/or a silica including a silicate precoat and/or to improve wetability and uniform distribution of the coating materials on the substrate and/or to provide a surface for reaction with the anion forming precursor. The precoats can comprise one or more members of a group of alumina, zirconium, silica, tungsten and titanium oxides and other oxide halides and organooxy halides. The precoats can be deposited on the substrates including inorganic and organic core substrates using any suitable technique such as hydrolysis and precipitation of a soluble salt. Further, as set forth above, the precoats can be deposited on the substrates using such techniques as spray coating, dip coating followed by drying such as spray drying. In addition, the precoat process can be repeated in order to obtain a precoat thickness to for example minimize deleterious effects from cations contained in the substrate and/or improve the thermal barrier properties of the precoat in relationship to an organic core and/or to provide the desired metal oxyanion coating thickness.

In addition to the above techniques for forming a precoat, the substrate particles, particularly the inorganic particles, can be processed in accordance with the process of this invention with a precoat forming material such as silicic acid or disilicic acid. In general, the precoat precursor would be combined with the substrate to form a precoat reaction mixture which is then subjected to process conditions in the reaction zone in order to obtain reaction of the precursor precoat component on the substrate. It is contemplated within the scope of this invention that a single or multi step process can be used, i.e. the first stage of a multistage being a precoat of the substrate in the reaction zone using the various types of feeds similar to those set forth above which contain the precoat precursor and subjecting such feed to fast reaction elevated temperature conditions in a reaction zone to form the precoated substrate. The precoated substrate can be combined with the metal oxyanion precursor to be further processed according to the process of this invention.

It has also been found that the substrate itself can be selectively reacted and/or melted at the surface to produce a reactive surface and/or a precoat barrier layer, preferably a melt/resolidification/metal oxyanion coating, still more preferably a majority or even greater crystalline layer on the outer surface of the inorganic substrate. The selective reaction and/or melting of the surface of the inorganic substrate can provide both the metal oxyanion coating and barrier properties as well as enhanced bondability of the metal oxyanion coating on the substrate, particularly with the formation of crystalline type surface coating as set forth above. The process for the selective reaction and/or melting of the surface of the inorganic substrate can be done in multiple process steps or in a single step in carrying out the process of this invention. For example, the selective melting of the external surface of the inorganic substrate can be done in a manner similar to the formation of a reactive and/or barrier coating as set forth above followed by incorporating the surface modified substrate along with the anion forming precursor to form the reactant mixture. The reaction mixture is then processed according to the process of this invention. In addition the reactant mixture can be introduced into the reaction zone under conditions wherein the selective reaction and/or melting and resolidification of the surface of the inorganic substrate takes place, i.e. a single step process in the presence of an anion forming precursor. It has been found that the inorganic substrate having a surface that has undergone selective reaction and/or melting, resolidification has unique properties with the inner core associated with the metal oxyanion coating. These improved properties can include enhanced coating and barrier properties, bonding of the inner core with the metal oxyanion coating and overall morphology stability.

In order to provide for controlled conductivity and/or absorption of metal oxyanion coatings, it is preferred that the substrate and/or inner core be substantially nonconductive and/or non-deleterious further reactive and/or substantially non-absorbing when the coated substrate is to be used as a component/such as additive in an electronic device, packaging device and/or film device. The substrate can be partially or completely inorganic, for example mineral, glass, ceramic and/or carbon. Examples of three dimensional substrates which can be coated using the present process include spheres, extrudates, flakes, fibers, aggregates, porous substrates, stars, irregularly shaped particles, tubes, such as having an average largest dimension of from about 0.05 microns to about 250 microns, more preferably from about 1 micron to about 75 microns.

A particularly unique embodiment of the present metal oxyanion coated particles is the ability to design a particular density for a substrate through the use of one or more open or closed cells, including micro and macro pores particularly, including cell voids in spheres which spheres are hereinafter referred to as hollow spheres. Thus such densities can be designed to be compatible and synergistic with other components used in a given application, particularly optimized for compatibility in liquid systems such as polymer film coating and composite compositions. The average particle density can vary over a wide range such as densities of from about 0.1 g/cc to about 2.00 g/cc, more preferably from about 0.13 g/cc to about 1.5 g/cc, and still more preferably from about 0.15 g/cc to about 0.80 g/cc.

A further unique embodiment of the present invention is the ability to selectively have a metal oxyanion coating on the outer surface area while limiting the metal oxyanion coating on the internal pore surface area of the substrate typically limiting the coating to at least about 10% non-coated internal pore surface area as a percentage of the total surface area of the substrate. Typically, the porous substrates will have a total surface area in the range of from about 0.01 to about 700 $m^2$/gram of substrate, more typically from about 1 to about 100 $m^2$/gram of substrate. Depending on the application such as for catalysts, the surface area may vary from about 10 to about 600 $m^2$/gram of substrate.

As set forth above, porous powder substrate particles can be in many forms and shapes, especially shapes which are not flat surfaces, i.e., non line-of-site materials such as pellets, fiber like, beads, including spheres, flakes, aggregates, and the like. The percent apparent porosity, i.e., the volume of open pores expressed as a percentage of the external volume can vary over a wide range and in general, can vary from about 20% to about 92%, more preferably, from about 40% to about 90%. A particularly unique porous substrate is diatomite, a sedimentary rock composed of skeletal remains of single cell aquatic plants called diatoms typically comprising a major amount of silica. Diatoms are unicellular plants of microscopic size. There are many varieties that live in both fresh water and salt water. The diatom extracts amorphous silica from the water building for itself what amounts to a strong shell with highly symmetrical perforations. Typically the cell walls exhibit lacework patterns of chambers and partitions, plates and apertures of great variety and complexity offering a wide selection of shapes. Since the total thickness of the cell wall is in the micron range, it results in an internal structure that is highly porous on a microscopic scale.

Further, the actual solid portion of the substrate occupies only from about 10–30% of the apparent volume leaving a highly porous material for access to liquid. The mean pore size diameter can vary over a wide range and includes macroporosity of from about 0.075 microns to 10 microns with typical micron size ranges being from about 0.5 microns to about 7.5 microns. As set forth above, the diatomite is generally amorphous and can develop crystalline character during calcination treatment of the diatomite. For purposes of this invention, diatomite as produced or after subject to treatment such as calcination are included within the term diatomite.

The particularly preferred macroporous particles for use in this invention are diatomites obtained from fresh water and which have fiber-like type geometry. By the term fiber-like type geometry is meant that the length of the diatomite is greater than the diameter of the diatomite and in view appears to be generally cylindrical and/or fiber-like. It has been found that these fiber-like fresh water diatomites provide improved properties in coatings and composite applications.

As set forth above, substrates can be inorganic for example, carbon including graphite and/or an inorganic oxide. Typical examples of inorganic oxides which are useful as substrates include for example, substrates containing one or more silicate, aluminosilicate, silica particularly high purity silica, sodium borosilicate, insoluble glass, soda lime glass, soda lime borosilicate glass, silica alumina, titanium dioxide, mica, as well other such glasses, ceramics and minerals which are modified with, for example, another oxide such as titanium dioxide and/or small amounts of iron oxide.

Additional examples of substrates are wollastonite, titanates, such as potassium hexa and octa titanate, carbonates and sulfates of calcium and barium; borates such as boric oxide, boric acid and aluminum borate, a natural occurring quartz and various inorganic silicates, clays, pyrophyllite and other related silicates.

A particularly unique metal oxyanion coated three-dimensional substrate is a flake and/or fiber particle, such as having an average largest dimension, i.e. length of from about 0.1 micron to about 200 microns more preferably from about 1 micron to about 100 microns, and still more preferably from about 5 microns to about 75 microns, particularly wherein the aspect ratio, i.e., the average particle length divided by the thickness of the particle is from about five to one to about 200 to 1, more preferably from about 25 to 1 to about 200 to 1 and still more preferably, from about 50 to 1 to about 200 to 1. Generally, the particles will have a thickness varying from about 0.1 microns to about 15 microns, more preferably from about 0.1 micron to about 10 microns. The average length, i.e., the average of the average length plus average width of the particle, i.e., flake, will generally be within the aspect ratios as set forth above for a given thickness. Thus for example the average length as defined above can vary from about 1 micron to about 300 microns, more typically from about 20 microns to about 150 microns. In general, the average length can vary according to the type of substrate and the method used to produce the platelet material. For example, C glass in general has an average length which can vary from about 20 microns up to about 300 microns, typical thicknesses of from about 1.5 to about 15 microns. Other particle materials for example, hydrous aluminum silicate mica, in general can vary in length from about 5 to about 100 microns at typical thicknesses or from about 0.1 to about 7.0 microns, preferably within the aspect ratios set forth above. In practice the particles which are preferred for use in such applications in general have an average length less than about 300 microns and an average thickness of from about 0.1 to about 15 microns. Ceramic fibers are particularly useful substrates.

A particular unique advance in new products resulting from the process of this invention are the production of metal oxyanion coated nano particle substrates typically having an average particle size less than 3,000 nanometers, typically less than 2000 and still typically less than 1000 nanometers. In many applications the average particle size will be less than about 200 nanometers. The particle size distribution of the nano particle substrates are skewed towards the smaller particle size and typically have greater than 90%, often greater than 95% of the total number particles on a weight basis, less than 3,000 nanometers, typically less than 2000 nanometers, and still more typically less than 1000 nanometers. It has been discovered that the use of liquid slurry reaction mixtures particularly metal oxyanion precursor which are soluble in the slurry liquid are able to produce metal oxyanion coated nanosubstrates which vary in thickness from about 2% to about 75%, more preferably from about 5% to about 60% of the average thickness on the smallest dimension of the substrate particle, such as the thickness in a flake or the diameter in a fiber. The various physical and chemical properties of the substrates and coatings as set forth above are applicable to nanosubstrates. The significant advantage of the soluble metal oxyanion precursor is the ability to provide the concentration of these coating forming components that produce the desired coating thickness on the nanosubstrates.

A particular unique substrate is referred to as swelling clays or smectites. These types of clays have a layered structure where in each layer can be treated to expand the spacing between layers such as to provide individual layers of the clay of vary small thicknesses such as from about 1 to 2 nanometers. The aspect ratios are significant particularly if the largest length extends to 1,000 nanometers. The spacing between the different sheets are called the gallery which are expanded upon treatment particularly with polar materials to provide for increased spacing between each sheet.

These phyllosilicates, such as smectite clays, e.g., sodium montmorillonite and calcium montmorillonite, can be treated with polar molecules, such as ammonium ions, to intercalate the molecules between adjacent, planar silicate layers, for intercalation of precursor between the layers, thereby substantially increasing the interlayer (interlaminar) spacing between the adjacent silicate layers. The thus-treated, interclalted phyllosilicates, having interlayer spacings of at least about 10–20. ANG. and up to about 100 .ANG., then can be exfoliated, e.g., the silicate layers are separated, e.g., mechanically, by high shear mixing. The individual layers have been found to substantially improve one or more properties of polymer coatings and composites, such as mechanical strength and/or high temperature characteristics.

Useful swellable layered materials include phyllosilicates, such as smectite clay minerals, e.g., montmorillonite, particularly sodium montmorillonite; magnesium montmorillonite and/or calcium montmorillonite; nontronite; beidellite; volkonskoite; hectorite; saponite; sauconite; sobockite; stevensite; svinfordite; vermiculite; and the like. Other useful layered materials include micaceous minerals, such as illite and mixed layered illite/smectite minerals, such as rectorite, tarosiovite, ledikite and admixtures of illites with the clay minerals set forth above.

As set forth above the reaction mixture can be in a flowable powder form with the metal oxyanion precursor present on the surface of the substrate as has been illustrated above. The metal oxyanion precursor can be associated with the surface of the substrate by attraction through opposite static charges. In addition a binder can be associated with the metal oxyanion precursor, which enhances the association of the precursor with the substrate. The binder can be inorganic or organic. As set forth above, the binder should not introduce any substantial deleterious contaminants into the metal oxyanion coating or substantially adversely affect the overall film properties such as conductive or absorption properties. The binders can be for example polymeric type such as polyvinylalcohol or polyvinylpyrrolidone. In addition, the binder can have both organic and inorganic functionality such as an organic silicate such as an ethyl silicate. In addition, the inorganic binders can be used such as calcium silicate, boric oxide and certain carbonate, nitrates and oxalates. In the case of organic binders it is preferred to use such organic binders that will be converted to a carbon oxide such as carbon monoxide or carbon dioxide under the process conditions in the reaction zone without leaving any substantial deleterious carbon or oxygen contaminant associated with the metal oxyanion coated substrate. In addition, the use of organic binders can provide for a reducing atmosphere in the reactor zone or the exit of the reactor zone. It is preferred to use a binderless flowable powder reaction mixture in order to eliminate potential contaminant effects. When a binder is used, the concentration of the binder is such as to maintain the individual particle substrate integrity or if agglomeration does occur, to be easily converted to nonagglomerated particles through low severity mechanical processing such as ball milling.

The coated particles are particularly useful in a number of applications, particularly conductivity and absorption type applications such as catalysts, thermal dissipation elements, electrostatic dissipation elements, electromagnetic interference shielding elements, electrostatic bleed elements, protective coatings and the like.

In practice spherical particles for use in applications in general have a roundness associated with such particles, generally greater than about 70% still more preferably, greater than about 85% and still more preferably, greater than about 95%. The spherical products offer particular advantages in many of such applications disclosed herein, including enhanced dispersion and rheology, particularly in various compositions such as polymer compositions, coating compositions, various other liquid and solid type compositions and systems for producing various products such as coatings and polymer composites. Typical examples of products are boron oxynitride, silicon oxycarbide and oxynitride, iron oxysilicide, titanium oxycarbide, boride and oxysilicide, aluminum oxynitride and molybdenum oxysilicide Any suitable matrix material or materials may be used in a composite with the metal oxyanion coated substrate. Preferably, the matrix material comprises a polymeric material, e.g., one or more synthetic polymers, more preferably an organic polymeric material. The polymeric material may be either a thermoplastic material or a thermoset material. Among the thermoplastics useful in the present invention, are the polyolefins, such as polyethylene, polypropylene, polymethylpentene and mixtures thereof; and poly vinyl polymers, such as polystyrene, polyvinylidene difluoride, combinations of polyphenylene oxyanion and polystyrene, and mixtures thereof. Among the thermoset polymers useful for powders of the present invention are epoxies, phenol-formaldehyde polymers, polyesters, polyvinyl esters, polyurethanes, melamine-formaldehyde polymers, and urea-formaldehyde polymers.

In addition, a thermal and/or electrostatic dissipation/electromagnetic interference shielding element is provided which comprises a three dimensional substrate, e.g., an inorganic substrate, having a conductive metal oxyanion-containing coating on at least a portion of all three dimensions thereof. The coated substrate is adapted and structured to provide at least one of the following: thermal and/or electrostatic dissipation and/or bleed and electromagnetic interference shielding.

A very useful application for the products of this invention is for static, for example, electrostatic, dissipation and shielding, particularly for polymeric parts, and more particularly as a means for effecting static dissipation including controlled static discharge and dissipation such as used in certain electro static painting processes and/or electric field absorption in parts, such as parts made of polymers and the like, as described herein. Certain of the present products can be incorporated directly into the polymer or a carrier such as a cured or uncured polymer based carrier or other liquid, as for example in the form of a liquid, paste, hot melt, film and the like. These product/carrier based materials can be directly applied to parts to be treated to improve overall performance effectiveness. A heating cycle is generally used to provide for product bonding to the parts. A particularly unexpected advantage is the improved mechanical properties, especially compared to metallic additives which may compromise mechanical properties. In addition, the products of this invention can be used in molding processes to allow for enhanced static dissipation and/or shielding properties of polymeric resins relative to an article or device or part without such product or products, and/or to have a preferential distribution of the product or products at the surface of the part for greater volume effectiveness within the part.

The particular form of the products, i.e., fibers, flakes, irregularly shaped and/or porous particles, or the like, is chosen based upon the particular requirements of the part and its application, with one or more of flakes, fibers and particles, including spheres, being preferred for polymeric parts. In general, it is preferred that the products of the invention have a largest dimension, for example, the length of fiber or particle or side of a flake, of less than about 300 microns, more preferably less than about 150 microns and still more preferably less than about 100 microns. It is preferred that the ratio of the longest dimension, for example, length, side or diameter, to the shortest dimension of the products of the present invention be in the range of about 500 to 1 to about 10 to 1, more preferably about 250 to 1 to about 25 to 1. The concentration of such product or products in the product/carrier and/or mix is preferably less than about 60 weight %, more preferably less than about 40 weight %, and still more preferably less than about 20 weight %. A particularly useful concentration is that which provides the desired performance while minimizing the concentration of product in the final article, device or part.

The products of this invention find particular advantage in static dissipation parts, for example, parts having a surface resistivity in the range of about $10^4$ ohms/square to about $10^{12}$ ohms/square. In addition, those parts generally requiring shielding to a surface resistivity in the range of about 1 ohm/square to about $10^5$ ohms/square and higher find a significant advantage for the above products due to their mechanical properties. A further advantage for certain of the above products is their ability to provide static dissipation and/or shielding in adverse environments such as in corrosive water and/or electro galvanic environments. As noted above, certain products have the ability to absorb electro fields. The unique ability of the products to absorb allows parts to be designed which can minimize the amount of reflected electro fields that is given off by the part. This latter property is particularly important where the reflected fields can adversely affect performance of the part.

In yet another embodiment, metal oxyanion coated substrates including oxycarbide and oxysulfide coatings such as molyoxycarbide and zanthanum oxysulfide, and optionally at least one additional catalyst component can be used as catalyst supports and/or catalysts in an amount effective to promote the desired chemical reaction. Preferably, the additional catalyst component is a metal and/or a component of a metal effective to promote the chemical reaction. A particularly useful class of chemical reactions are those involving selective chemical oxidation or reduction reactions including oxidative coupling of methane to alkanes and alkenes, hydrocarbon reforming, dehydrogenation, such as alkylaromatics to olefins, olefins to dienes, alcohols to ketones, hydrodecyclization, isomerization, ammoxidation, such as with olefins, aldol condensations using aldehydes and carboxylic acids and the like. Such reactions may be promoted using the present catalysts.

Any suitable additional catalyst component may be employed, provided that it functions as described herein. Among the useful metal catalytic components are those selected from components of tin compounds, the rare earth metals, certain other catalytic components and mixtures thereof, in particular catalysts containing gold, silver, copper, vanadium, chromium, cobalt molybdenum, tungsten, zinc, indium, the platinum group metals, i.e., platinum, palladium, and rhodium, iron, nickel, manganese, cesium, titanium, etc. Although metal containing compounds may be employed, it is preferred that the metal catalyst component (and/or metal sensing component) included with the metal oxyanion coated substrates comprise elemental metal and/or metal in one or more active oxidized forms, for example, $Cr_3O_3$, $Ag_2O$, etc.

The following examples illustrate the processes of this invention.

EXAMPLE 1

A flowable powder reaction mixture is formed from a high purity silica platelet having an average particle size of about 50 microns and titanium tetrachloride by liquid film formation using ultrasonic droplet formation.

The reaction mixture is fed into a reaction zone as an ammonia, oxygen gas mixture fluidized flowable powder at elevated temperature and at a preformed stoichiometry to form oxynitride. The elevated temperature of 2700° K. is maintained by an RF induction plasma system operating at a power of about 30 kW at a frequency of 3 MHz. The central swirl gas is argon and the sheath gas, a mixture of argon and hydrogen. The anion forming precursor carrier gas is ammonia and the oxy precursor gas is oxygen. The powder reaction mixture is introduced into the reaction zone at a flow rate of 35 grams per minute. The gas velocities in the reaction zone are controlled to allow for an average particle residence time of about 3.0 milliseconds. The temperature within the reaction zone is controlled to allow for the structural solid integrity maintenance of the substrate. The introduction of the reaction mixture is assisted by the gas atomization of the reaction mixture. A titanium oxynitride coated silica powder substrate is recovered in a collection zone. The collection zone uses a fabric bag filter to remove and recover the metal oxyanion coated substrates.

EXAMPLE 2

Example 1 is repeated except that tetramethoxy titanium is used as the metal oxyanion precursor, no oxygen is introduced into the reaction zone and methane is used as the anion forming precursor and part of the carrier gas. A titanium oxycarbide coated silica substrate is recovered in the collection chamber.

EXAMPLE 3

Example 1 is repeated except that a reducing flame combustion thermal source is used in place of the RF induction plasma system. In place of the central, sheath and carrier gases, a combustion gas having minimum mole % oxygen is generated using nitrogen diluted air and ammonia. The average particle substrate residence time in the reaction zone was 5 milliseconds. A titanium oxynitride coated silica substrate is recovered.

EXAMPLE 4

Example 1 is repeated except that the reaction mixture is a free flowing powder obtained from contacting the silica platelet substrate with a metal oxyanion precursor aluminum chloride. The powder reaction mixture is introduced at a rate of about 40 grams per minute. The average velocity of the particle substrate is 10 meters per second. An aluminum oxynitride silica platelet is recovered.

EXAMPLE 5

Example 4 is repeated except that the aluminum chloride is replaced by zirconium oxychloride. A zirconium oxynitride coating on the silica substrate is recovered in the collection zone.

EXAMPLE 6

Example 2 is repeated except that the substrate is mica and the mica is precoated with diethyl chlorosilane silica precursor in place of the titanium precursor to form a reactive coating. The average particle size of the mica is 20 microns. A silicon oxycarbide coated mica is recovered in the collection zone.

EXAMPLE 7

Example 6 is repeated except the mica is replaced with a polyimide powder having an average particle size of 40 microns. The silane precursor is diethyl chlorosilane. A silicon oxycarbide coated polyimide substrate is recovered.

EXAMPLES 8 AND 9

Examples 1 and 2 are repeated except the average particle substrate residence time is increased to 30 milliseconds. A product having a uniform crystalline coating on the silica substrate is recovered in the collection zone.

While this invention has been described with respect to various specific examples and embodiments, it is to be understood that the invention is not limited thereto and that it can be variously practiced within the scope of the following claims.

What is claimed is:

1. An article comprising a thermally associated nondeleterious contaminated metal oxyanion coated three dimensional powder particle substrate having an inner porous substrate core and a metal oxyanion coating thermally associated with at least a part of the external surface of said inner core without substantially adversely effecting the solid integrity of the substrate, said metal and anion being chemically different.

2. The article of claim 1 wherein the metal of the metal oxyanion coating is selected from the group consisting of titanium, boron, silicon, aluminum, molybdenum, zirconium, tungsten, nickel, lanthanum and mixtures thereof.

3. The article of claim 2 wherein the metal is selected from the group consisting of titanium, boron, aluminum and silicon and the inner core is a diatomite.

4. The article of claim 1 wherein the anion of the metal oxyanion coating is selected from the group consisting of carbide, boride, sulfide, silicide, and nitride.

5. The article of claim 4 wherein the anion is selected from the group consisting of nitride, boride, carbide and the inner core is a diatomite.

6. The article of claim 2 wherein the metal oxyanion coating is selected from the group consisting of metal oxycarbide, metal oxysilicide and metal oxynitride.

7. The article of claim 3 wherein the metal oxyanion coating is selected from the group consisting of metal oxynitride, metal oxysilicide and metal oxynitride.

8. An article comprising a thermally associated nondeleterious contaminated metal oxycarbide coated three dimensional powder particle substrate having an inner porous substrate core and a metal oxycarbide coating thermally associated with at least a part of the external surface of said inner core without substantially adversely effecting the solid integrity of the substrate, said metal and carbide being chemically different.

9. The article of claim 8 wherein the metal of the metal oxycarbide coating is selected from the group consisting of titanium, boron, silicon, aluminum, molybdenum, zirconium, tungsten, nickel, lanthanum and mixtures thereof.

10. The article of claim 9 wherein the metal is selected from the group consisting of titanium, boron, aluminum, molybdenum, silicon and the inner core is a diatomite.

11. The article of claim 8 wherein the metal oxycarbide coating is selected from the group consisting of silicon oxycarbide, titanium oxycarbide, molybdenum oxycarbide and zirconium oxycarbide.

12. The article of claim 11 wherein the metal oxycarbide coating is selected from the group consisting of silicon oxycarbide and titanium oxycarbide.

13. The article of claim 12 wherein the metal oxycarbide coating is titanium oxycarbide.

14. An article comprising a thermally associated nondeleterious contaminated metal oxynitride coated three dimensional powder particle substrate having an inner porous substrate core and a metal oxynitride coating thermally associated with at least a part of the external surface of said inner core without substantially adversely effecting the solid integrity of the substrate, said metal and nitride being chemically different.

15. The article of claim 13 wherein the metal of the metal oxynitride coating is selected from the group consisting of titanium, boron, silicon, aluminum, molybdenum, zirconium, tungsten, nickel, lanthanum and mixtures thereof.

16. The article of claim 14 wherein the metal is selected from the group consisting of titanium, boron, aluminum, molybdenum and silicon and the inner core is a diatomite.

17. The article of claim 13 wherein the metal oxynitride coating is selected from the group consisting of aluminum oxynitride, silicon oxynitride, molybdenum oxynitride and titanium oxynitride.

18. The article of claim 16 wherein the metal oxynitride coating is aluminum oxynitride.

19. The article of claim 16 wherein the metal oxynitride coating is boron oxynitride.

20. The article of claim 16 wherein the metal oxynitride coating is silicon oxynitride.

* * * * *